United States Patent
Bondokov et al.

(10) Patent No.: US 10,106,913 B2
(45) Date of Patent: *Oct. 23, 2018

(54) SYSTEM FOR GROWTH OF LARGE ALUMINUM NITRIDE SINGLE CRYSTALS WITH THERMAL-GRADIENT CONTROL

(71) Applicants: Robert T. Bondokov, Watervliet, NY (US); Shailaja P. Rao, Albany, NY (US); Shawn Robert Gibb, Clifton Park, NY (US); Leo J. Schowalter, Latham, NY (US)

(72) Inventors: Robert T. Bondokov, Watervliet, NY (US); Shailaja P. Rao, Albany, NY (US); Shawn Robert Gibb, Clifton Park, NY (US); Leo J. Schowalter, Latham, NY (US)

(73) Assignee: CRYSTAL IS, INC., Green Island, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/410,915

(22) Filed: Jan. 20, 2017

(65) Prior Publication Data
US 2017/0226661 A1 Aug. 10, 2017

Related U.S. Application Data

(63) Continuation of application No. 14/686,812, filed on Apr. 15, 2015, now Pat. No. 9,580,833, which is a continuation of application No. 13/173,213, filed on Jun. 30, 2011, now Pat. No. 9,028,612.

(60) Provisional application No. 61/360,142, filed on Jun. 30, 2010.

(51) Int. Cl.
| C30B 23/06 | (2006.01) |
| C30B 23/02 | (2006.01) |
| C30B 29/40 | (2006.01) |
| C30B 23/00 | (2006.01) |

(52) U.S. Cl.
CPC ............ *C30B 23/06* (2013.01); *C30B 23/002* (2013.01); *C30B 23/025* (2013.01); *C30B 29/403* (2013.01)

(58) Field of Classification Search
CPC ......... C30B 23/00; C30B 23/02; C30B 23/06; C30B 23/063; C30B 23/066; Y10T 117/00; Y10T 117/10; Y10T 117/1016
USPC .... 117/84, 88, 101–102, 200, 204, 937, 952
See application file for complete search history.

(56) References Cited

U.S. PATENT DOCUMENTS

| 8,222,650 B2 | 7/2012 | Schowalter et al. |
| 8,323,406 B2 | 12/2012 | Bondokov et al. |
| 9,028,612 B2 | 5/2015 | Bondokov et al. |
| 9,580,833 B2* | 2/2017 | Bondokov ............ C30B 23/002 |
| 2003/0168003 A1 | 9/2003 | Schowalter et al. |
| 2005/0227117 A1* | 10/2005 | Locher ................... C30B 15/34 428/702 |
| 2007/0101932 A1* | 5/2007 | Schowalter ........... C30B 11/003 117/84 |

(Continued)

*Primary Examiner* — Kenneth A Bratland, Jr.
(74) *Attorney, Agent, or Firm* — Morgan, Lewis & Bockius LLP

(57) ABSTRACT

In various embodiments, non-zero thermal gradients are formed within a growth chamber both substantially parallel and substantially perpendicular to the growth direction during formation of semiconductor crystals, where the ratio of the two thermal gradients (parallel to perpendicular) is less than 10, by, e.g., arrangement of thermal shields outside of the growth chamber.

24 Claims, 4 Drawing Sheets

(56) References Cited

U.S. PATENT DOCUMENTS

| | | |
|---|---|---|
| 2008/0006200 A1 | 1/2008 | Schowalter et al. |
| 2008/0182092 A1 | 7/2008 | Bondokov et al. |
| 2012/0000414 A1 | 1/2012 | Bondokov et al. |
| 2015/0218728 A1 | 8/2015 | Bondokov et al. |

* cited by examiner

| 400 | EVACUATE CHAMBER |
| --- | --- |
| 405 | REFILL CHAMBER WITH NITROGEN GAS |
| 410 | REPEAT STEPS 400 AND 405 |
| 415 | PRESSURIZE CHAMBER TO 1 BAR WITH A GAS INCLUDING, e.g., 95-100% $N_2$ AND 0-5% $H_2$ |
| 420 | PLACE SOURCE MATERIAL IN PROXIMAL END OF CRUCIBLE |
| 425 | PLACE CRUCIBLE IN SUSCEPTOR WITH ITS DISTAL END IN THE HIGH-TEMPERATURE REGION |
| 430 | INCREASE TEMPERATURE OF THE CRUCIBLE TO ABOUT 1800 °C |
| 435 | MAINTAIN GAS AT A PREDETERMINED SUPER-ATMOSPHERIC PRESSURE |
| 440 | RAMP TEMPERATURE TO GROWTH TEMPERATURE |
| 445 | DURING STEP 440, CONTINUOUSLY ADJUST PRESSURE TO MAINTAIN IT AT THE PRESSURE OF STEP 435 |
| 450 | ONCE GROWTH TEMPERATURE IS REACHED, DRIVE MECHANISM IS ACTUATED TO MOVE CRUCIBLE RELATIVE TO THE HEATED ZONE |
| 455 | MAINTAIN CONSTANT PRESSURE DURING STEP 450 |
| 460 | STOP MOVEMENT OF THE CRUCIBLE |
| 465 | COOL CRUCIBLE TO ROOM TEMPERATURE |

SYSTEM FOR GROWTH OF LARGE ALUMINUM NITRIDE SINGLE CRYSTALS WITH THERMAL-GRADIENT CONTROL

RELATED APPLICATION

This application is a continuation of U.S. patent application Ser. No. 14/686,812, filed on Apr. 15, 2015, which is a continuation of U.S. patent application Ser. No. 13/173,213, filed on Jun. 30, 2011, which claims the benefit of and priority to U.S. Provisional Patent Application No. 61/360,142, filed Jun. 30, 2010, the entire disclosure of each of which is hereby incorporated herein by reference.

GOVERNMENT SUPPORT

This invention was made with United States Government support under contract number DE-FC26-08-NT01578 awarded by the Department of Energy (DOE). The United States Government has certain rights in the invention.

FIELD OF THE INVENTION

In various embodiments, the present invention relates to systems and methods for fabricating nitride-based crystals, in particular systems and methods featuring enhanced control over the axial and radial thermal gradients during crystal growth.

BACKGROUND

Aluminum nitride (AlN) holds great promise as a semiconductor material for numerous applications, e.g., optoelectronic devices such as short-wavelength light-emitting diodes (LEDs) and lasers, dielectric layers in optical storage media, electronic substrates, and chip carriers where high thermal conductivity is essential, among many others. In principle, the properties of AlN may allow light emission at wavelengths down to around 200 nanometers (nm) to be achieved. Recent work has demonstrated that ultraviolet (UV) LEDs have superior performance when fabricated on low-defect AlN substrates prepared from bulk AlN single crystals. The use of AlN substrates is also expected to improve high-power radio-frequency (RF) devices made with nitride semiconductors due to the high thermal conductivity with low electrical conductivity. However, the commercial feasibility of AlN-based semiconductor devices is limited by the scarcity and high cost of large, low-defect single crystals of AlN.

To make large-diameter AlN substrates more readily available and cost-effective, and to make the devices built thereon commercially feasible, it is desirable to grow large-diameter (>25 mm) AlN bulk crystals at a high growth rate (>0.5 mm/hr) while preserving crystal quality. The most effective method of growing AlN bulk single crystals is the "sublimation-recondensation" method that involves sublimation of lower-quality (typically polycrystalline) AlN source material and recondensation of the resulting vapor to form the single-crystal AlN. U.S. Pat. No. 6,770,135 (the '135 patent), U.S. Pat. No. 7,638,346 (the '346 patent), and U.S. Pat. No. 7,776,153 (the '153 patent), the entire disclosures of which are incorporated by reference herein, describe various aspects of sublimation-recondensation growth of AlN, both seeded and unseeded. While these references recognize the benefits of a large axial (i.e., parallel to the primary growth direction) thermal gradient for optimizing material quality and growth rate of the growing AlN crystal, they utilize a growth apparatus designed to minimize the radial (i.e., perpendicular to the primary growth direction) thermal gradient. For example, axial thermal gradients may range from approximately 5° C./cm to approximately 100° C./cm, while radial thermal gradients are maintained at as negligible a level as possible. Likewise, other prior-art growth apparatuses utilize heavy insulation in order to minimize or eliminate the radial thermal gradient, as a minimized radial thermal gradient is expected to produce flat, high-quality crystals, particularly when efforts are made to grow crystals having large diameters. The radial gradient is typically minimized during conventional crystal growth in order to prevent formation of defects such as dislocations and low-angle grain boundaries. It is also minimized to make the surface of the growing crystal more flat, thus increasing the amount of useable material in the crystal (i.e., increasing the number of substrates that can be cut from the crystal for a given length of crystal).

FIG. 1 depicts an apparatus 100 utilized for the growth of AlN in accordance with the above-described prior art. As shown, a crucible 105 is positioned on top of a crucible stand 110 within a cylindrical susceptor 115. During the growth process, the susceptor 115 is translated within a heated zone created by surrounding heating coils (not shown), polycrystalline AlN source material 120 at the base 125 of the crucible sublimes at the elevated temperature, and the resulting vapor recondenses at the cooler tip 130 of the crucible due to the large axial thermal gradient between the base 125 and the tip 130, thus forming an AlN crystal 135. The apparatus 100 also features top axial shields 140 and bottom axial shields 145 designed and positioned to minimize the radial thermal gradient perpendicular to the growth direction 150 of AlN crystal 135. As shown, the tip 130 of the crucible 105 is cooler than the base 125 at least in part because apparatus 100 has fewer top axial shields 140 than bottom axial shields 145, allowing more heat to escape in the region of tip 130 and generating the desired axial thermal gradient. The top axial shields 140 may have centered holes therewithin to facilitate measurement of the temperature at tip 130 by a pyrometer 155. The centered hole diameter is minimized to reduce the heat flow but sufficient to form a practical optical path for the temperature sampling by the pyrometer 155. Additional pyrometers 160, 165 may also be utilized to measure temperatures at other regions of apparatus 100.

As mentioned above, the ability to grow AlN single crystals at high growth rates would spur additional commercial adoption of the technology. While increasing the growth rate of AlN crystals is theoretically possible by increasing the Al supersaturation using larger axial thermal gradients, increases in the Al supersaturation may result in deterioration of the material quality of the crystal, or even in polycrystalline, rather than single-crystal, growth. Furthermore, the minimization or elimination of radial thermal gradients during AlN crystal growth unexpectedly tends to deleteriously impact the quality of the AlN crystal, particularly when attempts are made to grow large (e.g., >25 mm diameter) crystals at reasonable growth rates (e.g., >0.5 mm/hr). Thus, a need exists for systems and techniques enabling growth of such large AlN crystals at high growth rates while still preserving high material quality of the AlN crystal.

SUMMARY

Embodiments of the current invention achieve high growth rates (e.g., greater than approximately 0.5 mm/hr) of large, high-quality single-crystal semiconductors (e.g., AlN) by forming and maintaining non-zero axial and radial thermal gradients in the growth apparatus such that the ratio of the axial thermal gradient to the radial thermal gradient (the "thermal gradient ratio") is greater than zero and less than 10. (As utilized herein, a thermal gradient being maintained does not necessarily imply that it is held constant as a function of time, only that it is non-zero (and constant or fluctuating) over a period of time.) The size and the quality of growing crystals are generally influenced by the thermal field within the growth cell. The axial thermal gradient is the magnitude of the thermal field projected on the longitudinal symmetry axis in a cylindrical coordinate system. The radial thermal gradient is the projection of the thermal field magnitude on the azimuthal direction. Therefore, the thermal gradient in any other direction may be described as a superposition of the axial and radial thermal gradients (and thus may also be controlled as the axial and/or radial thermal gradients are controlled). The deliberate formation and control of the radial thermal gradient large enough to result in a thermal gradient ratio less than 10 contradicts the above-described conventional wisdom in which radial thermal gradients (which may depend at least in part on the dimensions and shape of the growth chamber), even if formed at all (e.g., unintentionally) are eliminated or minimized to small magnitudes.

In some embodiments, the radial thermal gradient and the axial thermal gradient are substantially balanced and, preferably, the thermal gradient ratio ranges from approximately 1.2 to approximately 5.5. In order to facilitate formation and control of the radial thermal gradients, crystal-growth apparatuses in accordance with various embodiments of the invention utilize different types, thicknesses, and/or arrangements of thermal shields, particularly in the area "behind" the growing crystal (i.e., corresponding to the location of the top axial shields 140 in FIG. 1). Thus, for embodiments featuring seeded growth of AlN single crystals, one or more shields are typically located opposite the growth surface of the seed. The one or more shields utilized in preferred embodiments of the invention include or consist essentially of one or more refractory materials, e.g., tungsten, and may be substantially thin, i.e., have thicknesses less than 0.5 mm, e.g., ranging from 0.125 mm to 0.5 mm.

In one aspect, embodiments of the invention feature a method of forming single-crystal aluminum nitride (AlN). Vapor comprising or consisting essentially of aluminum and nitrogen is condensed within a growth chamber, thereby forming an AlN single crystal that increases in size along a growth direction. During the formation, a first (e.g., axial) non-zero thermal gradient is formed and maintained within the growth chamber in a direction substantially parallel to the growth direction, and a second (e.g., radial) non-zero thermal gradient is formed and maintained within the growth chamber in a direction substantially perpendicular to the growth direction. The ratio of the first thermal gradient to the second thermal gradient is less than 10.

Embodiments of the invention may include one or more of the following in any of a variety of combinations. Solid source material (which may include or consist essentially of, e.g., polycrystalline AlN) may be sublimed within the growth chamber to form the vapor. The second thermal gradient may be larger than 4° C./cm and/or smaller than 85° C./cm. The ratio of the first thermal gradient to the second thermal gradient may be greater than 1.2. The first thermal gradient may be larger than 5° C./cm and/or smaller than 100° C./cm. The ratio of the first thermal gradient to the second thermal gradient may be less than 5.5, or even less than 3.

Forming the second thermal gradient may include or consist essentially of arranging a plurality of thermal shields outside the growth chamber. Each of the thermal shields may include or consist essentially of a refractory material, e.g., tungsten. Each thermal shield may define an opening therethrough. The openings of the thermal shields may be substantially equal in size to each other. The opening of each thermal shield may range from approximately 10 mm to approximately 2 mm less than the dimension of the growth chamber substantially perpendicular to the growth direction. The openings of at least two of the thermal shields may be different in size. A first thermal shield having a first opening may be disposed between the growth chamber and a second thermal shield, the second thermal shield having a second opening larger than the first opening. At least two of the thermal shields may have different thicknesses. The thickness of each of the thermal shields may range from approximately 0.125 mm to approximately 0.5 mm.

The growth chamber may include a lid disposed between the AlN single crystal and at least one (or even all) of the thermal shields. The thickness of the lid may be less than approximately 0.5 mm. The lid may include or consist essentially of tungsten. A seed may be disposed within the growth chamber before forming the AlN single crystal, and the AlN single crystal may form on the seed and extend therefrom in the growth direction. The diameter of the seed may be greater than approximately 25 mm. The growth rate of the AlN single crystal may be greater than approximately 0.5 mm/hr. The AlN single crystal may form on a seed disposed within the growth chamber.

In another aspect, embodiments of the invention feature a crystal-growth system including or consisting essentially of a growth chamber for the formation of a single-crystal semiconductor material via sublimation-recondensation therewithin along a growth direction, a heating apparatus for heating the growth chamber, and a plurality of thermal shields arranged to form, within the growth chamber, (i) a first non-zero thermal gradient in a direction substantially parallel to the growth direction and (ii) a second non-zero thermal gradient in a direction substantially perpendicular to the growth direction. The ratio of the first thermal gradient to the second thermal gradient is less than 10.

Embodiments of the invention may include one or more of the following in any of a variety of combinations. Each thermal shield may define an opening therethrough. The openings of at least two of the thermal shields may be different in size. A first thermal shield having a first opening may be disposed between the growth chamber and a second thermal shield, the second thermal shield having a second opening larger than the first opening. At least two of the thermal shields may have different thicknesses. The thickness of each of the thermal shields may range from approximately 0.125 mm to approximately 0.5 mm. Each of the thermal shields may include or consist essentially of a refractory material, e.g., tungsten. The thermal shields may be arranged with substantially equal spacings therebetween. A seed for nucleating the single-crystal semiconductor material thereon may be disposed within the growth chamber. The diameter of the seed may be greater than approximately 25 mm, and/or the seed may include or consist essentially of aluminum nitride. The ratio of the first thermal gradient to the second thermal gradient may be less than 5.5, or even less than 3. The ratio of the first thermal gradient to the second thermal gradient may be greater than 1.2.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Unless otherwise indicated, "radial" generally refers to a direction substantially perpendicular to the primary crystal growth direction and/or the long axis of the crystal and/or the crystal-growth apparatus. Refractory materials are generally materials that are physically and chemically stable at temperatures above approximately 500° C. As used herein, the term "substantially" means±10%, and, in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4 is a table listing various steps of a process for growth of semiconductor crystals such as AlN in accordance with various embodiments of the invention.

DETAILED DESCRIPTION

Figure 1:
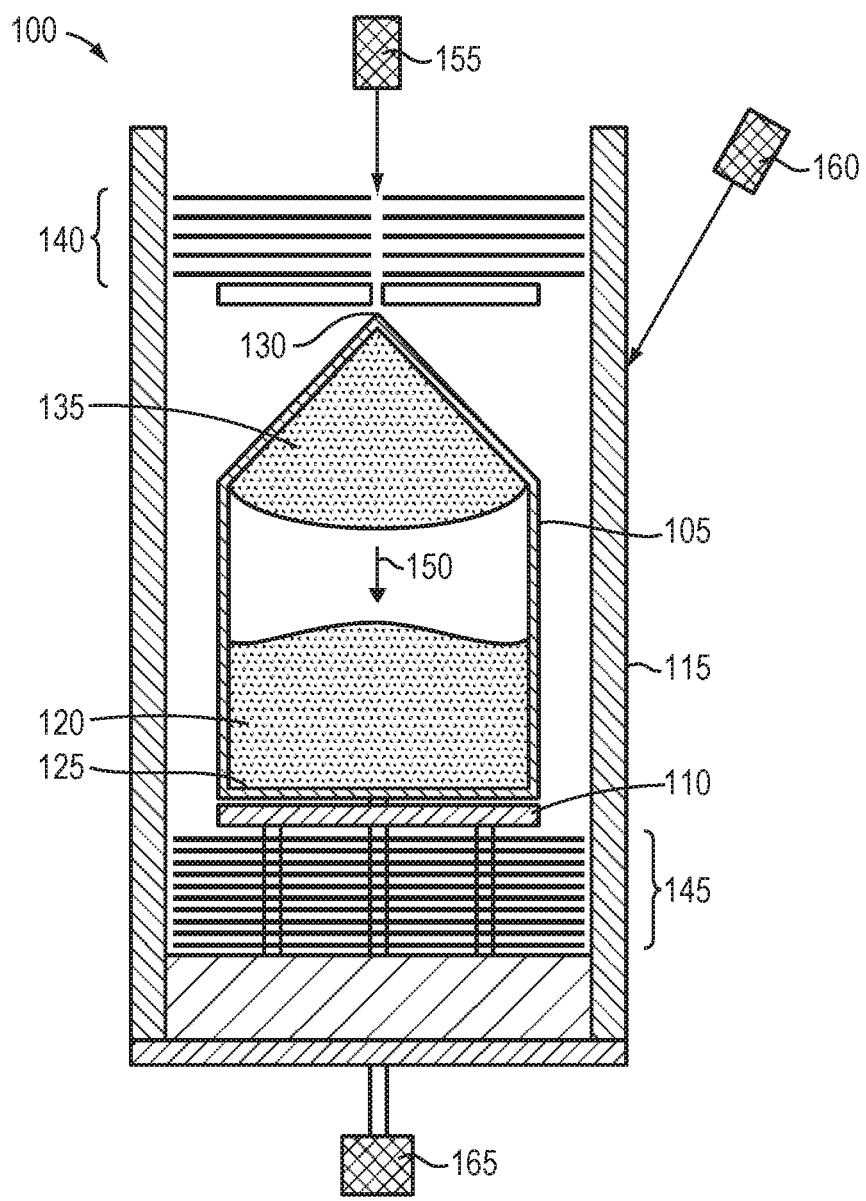
FIG. 1 is a schematic cross-section of a crystal-growth apparatus in accordance with the prior art in which radial thermal gradients are minimized or eliminated.
Figure 2:
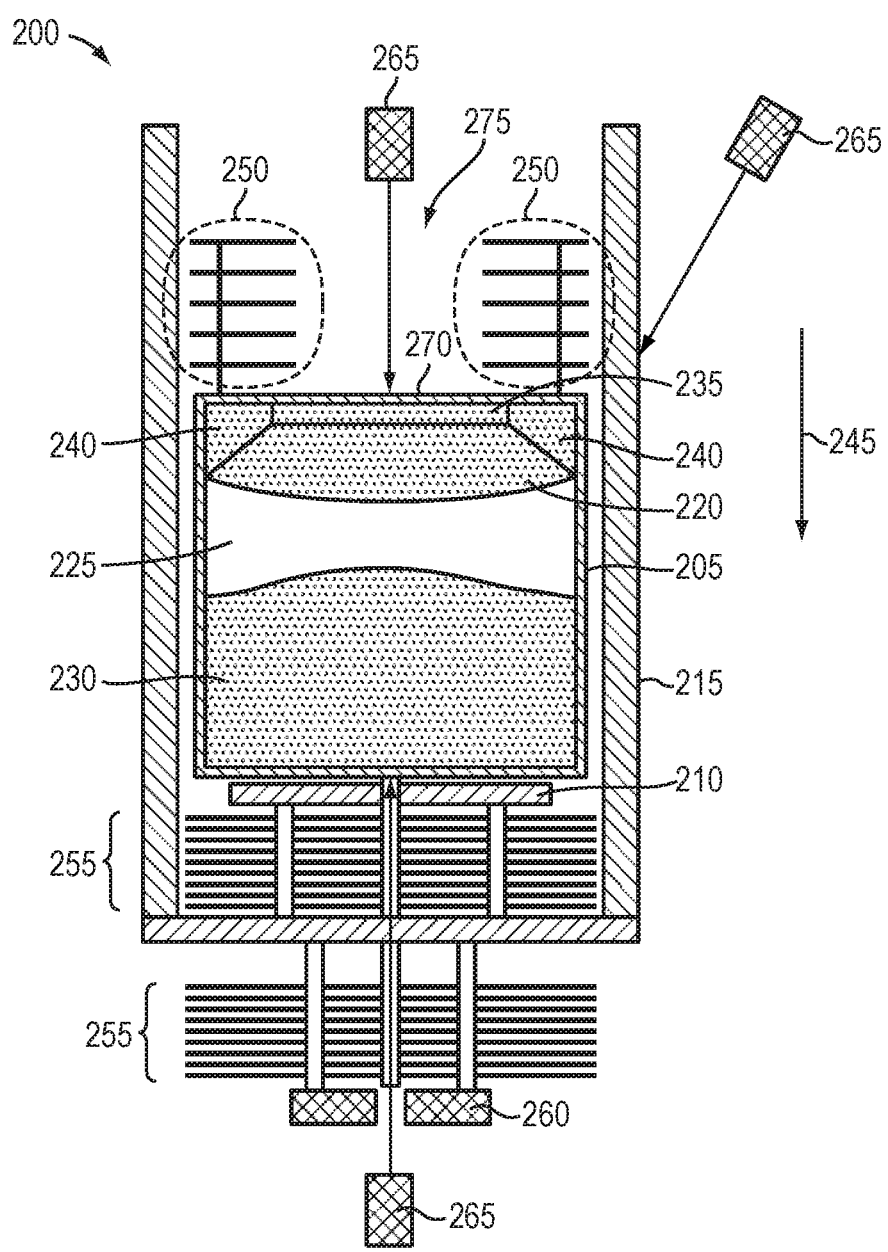
FIG. 2 is a schematic cross-section of a crystal-growth apparatus in accordance with various embodiments of the invention in which radial thermal gradients are generated and/or controlled.

FIG. 2 depicts a crystal-growth apparatus 200 suitable for the growth of single-crystal semiconductor materials (e.g., AlN, $Al_xGa_{1-x}N$, $B_xAl_{1-x}N$, and/or $B_xGa_yAl_{1-x-y}N$) in accordance with various embodiments of the present invention. As shown, apparatus 200 includes a crucible 205 positioned on top of a crucible stand 210 within a susceptor 215. Both the crucible 205 and the susceptor 215 may have any suitable geometric shape, e.g., cylindrical. During a typical growth process, the semiconductor crystal 220 is formed by condensation of a vapor 225 that includes or consists essentially of the elemental and/or compound precursors of the semiconductor crystal 220. For example, for a semiconductor crystal 220 including or consisting essentially of AlN, vapor 225 may include or consist essentially of Al and N atoms and/or $N_2$ molecules. In preferred embodiments, the vapor 225 arises from the sublimation of a source material 230, which may include or consist essentially of the same material as semiconductor crystal 220, only in polycrystalline form. Source material 230 may be substantially undoped or doped with one or more dopants, and use of a doped source material 230 typically results in semiconductor crystal 220 incorporating the dopant(s) present in source material 230. The semiconductor crystal 220 may form on and extend from a seed crystal 235. (Alternatively, the semiconductor crystal 220 may nucleate upon and extend from a portion of the crucible 205 itself, in the manner depicted in FIG. 1.) The seed crystal 235 may be a single crystal (e.g., a polished wafer) including or consisting essentially of the same material as semiconductor crystal 220 or may be a different material.

The crucible 205 may include or consist essentially of one or more refractory materials, such as tungsten, rhenium, and/or tantalum nitride. As described in the '135 patent and the '153 patent, the crucible 205 may have one or more surfaces (e.g., walls) configured to selectively permit the diffusion of nitrogen therethrough and selectively prevent the diffusion of aluminum therethrough.

As shown in FIG. 2, during formation of the semiconductor crystal 220, a polycrystalline material 240 may form at one or more locations within the crucible 205 not covered by the seed crystal 235. However, the diameter (or other radial dimension) of the semiconductor crystal 220 may expand, i.e., increase, during formation of the semiconductor crystal 220, thereby occluding the regions of polycrystalline material 240 from impinging vapor 225 and substantially limiting or even eliminating their growth. As shown in FIG. 2, the diameter of the semiconductor crystal 220 may expand to (or even start out at, in embodiments utilizing larger seed crystals 235) be substantially equal to the inner diameter of the crucible 205 (in which case no further lateral expansion of the semiconductor crystal 220 may occur).

The growth of the semiconductor crystal 220 along a growth direction 245 typically proceeds due to a relatively large axial thermal gradient (e.g., ranging from approximately 5° C./cm to approximately 100° C./cm) formed within the crucible 205. A heating apparatus (not shown in FIG. 2 for clarity), e.g., an RF heater, one or more heating coils, and/or other heating elements or furnaces, heats the susceptor 215 (and hence the crucible 205) to an elevated temperature typically ranging between approximately 1800° C. and approximately 2300° C. The apparatus 200 features one or more sets of top thermal shields 250, as well as one or more sets of bottom axial thermal shields 255, arranged to create the large axial thermal gradient (by, e.g., better insulating the bottom end of crucible 205 and the source material 230 from heat loss than the top end of crucible 205 and the growing semiconductor crystal 220). During the growth process, the susceptor 215 (and hence the crucible 205) may be translated within the heating zone created by the heating apparatus via a drive mechanism 260 in order to maintain the axial thermal gradient near the surface of the growing semiconductor crystal 220. One or more pyrometers 265 (or other characterization devices and/or sensors) may be utilized to monitor the temperature at one or more locations within susceptor 215. The top thermal shields 250 and/or the bottom thermal shields 255 may include or consist of one or more refractory materials (e.g., tungsten), and are preferably quite thin (e.g., between approximately 0.125 mm and 0.5 mm thick).

As mentioned above, the maximum mass transfer from source material 230 and/or vapor 225 (and therefore growth rate of semiconductor crystal 220) is typically achieved by maximizing the axial thermal gradient within the crucible 205 (i.e., maximizing the temperature difference between the source material 230 and the growing crystal 220 so that the growing crystal 220 has greater supersaturation). In preferred embodiments, the onset of crystal-quality deterioration (e.g., increased dislocation density, formation of grain boundaries, and/or polycrystalline growth) sets the approximate upper limit of the supersaturation at a given growth temperature. For typical growth temperatures (e.g., between approximately 2125° C. and approximately 2275° C.), this upper limit of the axial temperature gradient is generally approximately 100° C./cm (although this maximum may depend at least in part on the dimensions and/or shape of the growth chamber, and may thus be larger for some systems). However, as the cross-sectional area of the semiconductor crystal 220 increases (and/or for larger-area seed crystals 235), the probability of parasitic nucleation (on the seed crystal 235 or in other locations) increases. Each parasitic nucleation event may lead to formation of an additional growth center and result in grain or sub-grain formation (and thus low-quality and/or polycrystalline material). Minimizing the probability of parasitic nucleation is preferably achieved by providing a non-zero radial thermal gradient in a direction substantially perpendicular to the growth direction 245 that promotes lateral growth. Formation of the radial thermal gradient also enables growth of larger, high-quality crystals at high growth rates, as previously mentioned.

In accordance with various embodiments of the invention, the top thermal shields 250 are also arranged to form the non-zero radial thermal gradient within crucible 205. The radial thermal gradient is preferably larger than 4° C./cm, e.g., ranging between 4° C./cm and 85° C./cm (although, as described above relative to the axial thermal gradient, these values may depend on the specific dimensions and/or shape of the crucible). In preferred embodiments, the axial and radial temperature gradients are balanced. The radial and axial thermal gradients are balanced when the magnitudes of the gradients are within their upper limits (as detailed below). Preferably, the ratio between the axial and radial gradients (the thermal gradient ratio) is less than 10, less than 5.5, or even less than 3 at any given point inside the crucible 205. The thermal gradient ratio is also preferably greater than 1.2, e.g., ranging from 1.2 to 5.5. The maximum (i.e., upper limit) radial temperature gradient is a function of the growth temperature and is preferably defined by the onset of cracking and/or increased dislocation density (and/or grain-boundary formation) in semiconductor crystal 220. At the growth temperature, dislocation arrays, or even grain boundaries, may form at elevated radial thermal gradients. Such defects usually exhibit center-symmetric patterns. The minimum (i.e., lower limit) of the radial thermal gradient is preferably set by complete lack of lateral growth of the semiconductor crystal 220 perpendicular to the growth direction 245.

As noted above, after the semiconductor crystal 220 has laterally expanded to the inner dimension of the crucible 205 the expansion generally ceases. However, preferred embodiments of the invention maintain a non-zero radial thermal gradient (which may be different from the radial thermal gradient during the expansion of the semiconductor crystal 220) even after the lateral expansion of semiconductor crystal 200 has ceased in order to maintain high crystalline quality. The non-zero positive (as defined herein) radial thermal gradient generally results in semiconductor crystal 220 having a convex surface during growth (e.g., as shown in FIG. 2). Lateral growth of semiconductor crystal 220 promotes growth-center coalescence, and preferably growth initiates and proceeds from only one growth center. Even in such a case, there is preferably some non-zero magnitude of the radial gradient to prevent formation of additional growth centers. Examples of balanced axial and radial thermal gradients for growth of semiconductor crystal having a diameter of approximately two inches are set forth in the table below.

| Growth temperature (° C.) | Thermal gradient upper limit (° C./cm) | | Axial/Radial ratio |
| --- | --- | --- | --- |
| | Axial | Radial | |
| 1800 | 25 | 12 | 2.1 |
| 2250 | 105 | 45 | 2.3 |

In preferred embodiments, the crucible 205 has a lid 270 with sufficient radiation transparency to enable at least partial control of the thermal profile within the crucible 205 via the arrangement of the top thermal shields 250. Furthermore, in embodiments featuring a seed crystal 235, the seed crystal 235 is typically mounted on the lid 270 prior to the growth of semiconductor crystal 220. The lid 270 is typically mechanically stable at the growth temperature (e.g., up to approximately 2300° C.) and preferably substantially prevents diffusion of Al-containing vapor therethrough. Lid 270 generally includes or consists essentially of one or more refractory materials (e.g., tungsten, rhenium, and/or tantalum nitride), and is preferably fairly thin (e.g., less than approximately 0.5 mm thick).

The arrangement of the top thermal shields 250 provides control of the radial thermal profile, and hence provide the radial gradient preferred to maintain high crystal quality at high growth rates and to form and maintain the desired thermal gradient ratio. Simultaneously, the shield arrangements provide the necessary heat transfer to ensure the maximum growth rate. The balance between the axial and radial thermal gradients may be achieved by providing certain opening arrangements of the shields. As shown in FIG. 2, each of the top thermal shields typically has an opening 275 therethrough. The opening 275 normally echoes the geometry and/or symmetry of the crucible 205 (e.g., the opening 275 may be substantially circular for a cylindrical crucible 205). The size of each opening 275 may be varied; typically, the size(s) range from a minimum of 10 mm to a maximum of approximately 5 mm (or even 2 mm) less than the diameter of the crucible 205.

For example, in a preferred embodiment, five thermal shields 250, each having a diameter of 68.5 mm and an opening size (diameter) of 45 mm, are used. The thickness of each of the thermal shields 250 is 0.125 mm, and the thermal shields 250 are spaced approximately 7 mm from each other. At a typical growth temperature of 2065° C., this shield arrangement results in a radial thermal gradient (measured from the center of the semiconductor crystal to the inner edge of the crucible) of 27° C./cm.

As shown in FIG. 2, the top thermal shields 250 may have openings 275 larger than any such opening present in the bottom thermal shields 255, and/or the top thermal shields 250 may be stacked with one or more spacings between shields that are larger than that between the various bottom thermal shields 255. The spacings may range between approximately 1 mm and approximately 20 mm, and preferably between approximately 7 mm and approximately 20 mm. Also as shown, the openings 275 in the top thermal shields 250 may all be substantially equal to each other. Depending upon the desired growth conditions (e.g., pressure, temperature, crucible dimensions, distance between the seed crystal and the source material, etc.), the number of top thermal shields 250, the spacing between shields 250, and/or the size of the openings 275 may be varied to form the desired radial thermal gradient and hence, the desired thermal gradient ratio. The radial thermal gradient may even be varied in real time during the growth of semiconductor crystal 220, e.g., in response to feedback based on determination of the radial thermal gradient during growth. For example, the radial thermal gradient may be determined based on the temperatures of lid 270 and one or more sides of crucible 215 (e.g., measured by pyrometers 265 as shown in FIG. 2).

Similarly, although each of the top thermal shields 250 preferably has a thickness less than 0.5 mm, the thickness of one or more of the shields 250 may be varied with respect to the others. For example, one or more top thermal shields 250 may have a thickness of approximately 0.25 mm while one or more others have a thickness of approximately 0.125 mm. The thickness of the top thermal shields 250 may even be varied as a function of distance away from the lid 270 (i.e., either increasing or decreasing). Such thermal shields 250 having different thicknesses may be utilized to adjust the thermal field above and within the crucible 215. For example, a thicker shield may be used to block more radiative heat flow but will typically have higher thermal impact at temperatures where the heat flux is dominated by the thermal conductivity (lower temperatures, e.g. <1500°-1800°). Therefore, the resultant radial thermal gradient may vary as a function of growth temperature, even with the same arrangement of the same top thermal shields 250.

Figure 3A:
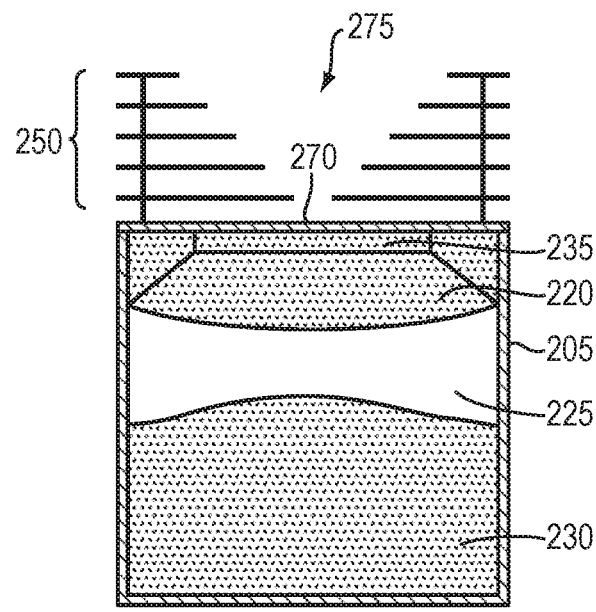
FIGS. 3A and 3B are schematic cross-sections of portions of the crystal-growth apparatus of FIG. 2 with alternate arrangements of top thermal shields, in accordance with various embodiments of the invention.
Figure 3B:
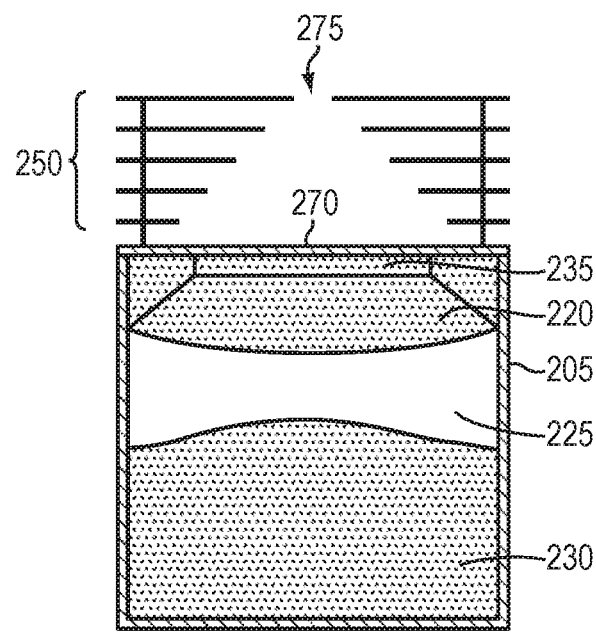

FIGS. 3A and 3B depict alternative arrangements of the top thermal shields 250 for producing a radial thermal gradient within crucible 205. Specifically, the openings 275 in the top thermal shields 250 can be varied as a function of distance away from the lid 270. As shown in FIG. 3A, the top thermal shields 250 may be arranged such that their openings 275 increase in size with increasing distance from lid 270. FIG. 3B depicts an alternate arrangement in which the top thermal shields are arranged such that their openings 275 decrease in size with increasing distance from lid 270. Of course, either of the arrangements of FIGS. 3A and 3B may be combined with any of the other arrangement variations described previously. In some embodiments, the arrangement of FIG. 3A is preferred, as it increases the probability of forming and maintaining a single growth center (where the narrowest opening is located) at the initial stages of growth.

Having described the principles and apparatus of various embodiments of the present invention, the method of operation, i.e., a growth process for AlN using the system described above is now described in conjunction with FIG. 4. As listed therein, in some embodiments, crystal growth initially involves evacuating the susceptor 215 (step 400), e.g., to pressures on the order of about 0.01 mbar (1 Pa) using a vacuum pump. The susceptor 215 is then refilled with an inert gas or a gas including or consisting essentially of nitrogen (step 405). These steps are preferably repeated one or more times to minimize oxygen and moisture contamination (step 410). Steps 400-410 may be performed by evacuating and refilling a process chamber (not shown in FIG. 2) that houses the susceptor 215 and various other portions of apparatus 200, and references to the "chamber" below may refer to such a chamber or to the susceptor 215. The chamber is then pressurized to about 1 bar (100 kPa) with nitrogen gas which is preferably mixed with a small amount of hydrogen (step 415). For example, a gas including or consisting essentially of about 95-100% $N_2$ and 0-5% $H_2$ is suitable in many embodiments. In particular embodiments, a commercially-available mixture of about 3% $H_2$ and 97% $N_2$ is employed. Polycrystalline AlN source material 230 is placed at a proximal end of the crucible 230 (step 420). The crucible 230 may then be evacuated and sealed, or may be provided with selective openings as described hereinabove. The crucible 230 is then disposed concentrically within the susceptor 215 with its distal end opposite the source material 230 (at which a seed crystal 235 may be disposed) in the high-temperature region of the heating zone produced by the heating apparatus (e.g., a furnace (step 425). The temperature is then increased to bring the distal end of the crucible 205 to a temperature of approximately 1800° C., in particular embodiments, within about 15 minutes (step 430). At the end of this temperature ramp, the gas pressure is set and maintained at a predetermined super-atmospheric pressure (step 435), and the temperature is ramped to a final crystal-growth temperature (step 440), e.g., in about 5 hours. As mentioned above, the final crystal-growth temperature may range between approximately 1800° C. and approximately 2300° C. During the temperature ramp, the pressure may be continuously adjusted, e.g., using a vent valve (not shown) to maintain it at that fixed super-atmospheric value (step 445). One potential advantage of this ramping is the enhancement of the purity of the source material 230 by permitting part of any oxygen still contained within it to diffuse out of the crucible 205 (e.g., through the crucible walls). This diffusion occurs because the vapor pressure of the aluminum suboxides (such as $Al_2O$, AlO, etc.) generated due to the presence of oxygen in the source material 230, is known to be higher than that of Al over AlN for the same temperature.

Once the growth temperature is reached, the drive mechanism 260 is actuated to move the distal end of crucible 205 towards the distal end of the chamber, and relative to the axial thermal gradient produced at least in part by the heating apparatus and the arrangement of the top and bottom thermal shields (step 450). Preferably, the distal end of crucible 205 is initially located within the highest-temperature region of the susceptor 215 at the beginning of the growth run. As the crucible 205 moves upwards the distal end of crucible 205 becomes cooler than the source material 230, which promotes effective mass transport from the source material 230 to the colder region of the crucible 205.

During the growth process, the pressure is preferably maintained at a constant predetermined value (step 455). The most appropriate value for this pressure typically depends on the axial spacing between the source material 230 and the (closest) surface of the growing crystal 220, as well as the rate of nitrogen diffusion through the crucible walls or flow through other openings. It may also be appropriate to actively adjust the gas pressure over a relatively narrow range during crystal growth to compensate for any changes in the spacing between the surface of the sublimating source material 230 and the growing crystal surface.

In particular embodiments, a pressure of about 18 psi has been used to demonstrate growth rates of 0.9 mm/hr with a separation between the source material 230 and the surface of the crystal 220 of approximately 2 cm, employing tungsten crucibles fabricated by either chemical vapor deposition or powder metallurgy technique (such as those described in commonly assigned U.S. Pat. No. 6,719,843, the entirety of which is incorporated by reference herein). The source-to-growing-crystal-surface distance may vary during the growth run if the area of the growing crystal surface is different from the surface area of the source material 230 and the growth rate (i.e., axial rate of movement of the crucible through the temperature gradient) may be adjusted to account for any such change. However, typically the surface area of the source material 230 and growing crystal surface will be kept nominally constant and approximately the same size so that the separation between the source and growing crystal surface will remain substantially constant during most of the growth.

Finally, the movement of crucible 205 is stopped (step 460) and a cooling ramp (step 465) is established to bring the apparatus and the crystal 220 to room temperature. Using pressures in the range 100 kPa to 150 kPa (1 atm to 1.5 atm), single-crystal boules have been grown at an axial pushing rate ranging between about 0.4 and 0.9 mm/h, for example, at the rate of 0.455 mm/h. By adjusting the distance between the source material and the growing crystal surface, and by adjusting the axial and radial temperature gradients, other useful growth conditions may be obtained. Hence, skilled practitioners may usefully use various embodiments of the present invention with total chamber pressures from 50 kPa to 1 MPa (0.5 atm to 10 atm) and axial pushing/growth rates of 0.3 to about 3 mm/h, or even higher.

By slicing or cutting the bulk single crystals of embodiments of the present invention, crystalline substrates, e.g., of AlN, of desired thickness—for example, about 500 μm or 350 μm—may be produced. These substrates may then be prepared, typically by polishing, for high-quality epitaxial growth of appropriate layers of AlN, GaN, InN and/or their binary and tertiary alloys to form electronic and optoelectronic devices such as UV laser diodes and high-efficiency UV LEDs. The aforementioned nitride layers may be described by the chemical formula $Al_xGa_yIn_{1-x-y}N$, where $0 \leq x \leq 1$ and $0 \leq y \leq 1-x$.

In various embodiments, the surface preparation of crystals including or consisting essentially of AlN enables high-quality epitaxial growth of nitride layers on the AlN substrate. Surface damage is preferably carefully removed in order to obtain high-quality epitaxial layers needed for fabrication of high performance nitride semiconductor devices. One successful approach to remove surface damage from the AlN substrate is to employ a chemical-mechanical polishing (CMP) approach, e.g. as described in U.S. Pat. No. 7,037,838 (the '838 patent), incorporated herein by reference in its entirety. Through this approach, very high-quality epitaxial layers of $Al_xGa_yIn_{1-x-y}N$ with low dislocation densities may be produced using organometallic vapor phase epitaxy (OMVPE), particularly when x exceeds 0.5. Those skilled in the art will recognize that other epitaxial growth techniques such as molecular beam epitaxy (MBE) or hydride vapor phase epitaxy (HVPE) may also be successfully employed to produce high-quality epitaxial layers on the high-quality semiconductor crystals produced in accordance with embodiments of the present invention.

The growth of bulk single crystals has been described herein primarily as being implemented by what is commonly referred to as a "sublimation" or "sublimation-recondensation" technique wherein the source vapor is produced at least in part when, for production of AlN, crystalline solids of AlN or other solids or liquids containing AlN, Al or N sublime preferentially. However, the source vapor may be achieved in whole or in part by the injection of source gases or like techniques that some would refer to as "high-temperature CVD." Also, other terms are sometimes used to describe these and other techniques that are used to grow bulk single AlN crystals according to this invention. Therefore, the terms "depositing," "depositing vapor species," and like terms will sometimes be used herein to generally cover those techniques by which the crystal may be grown pursuant to embodiments of this invention.

Thus, the single-crystal semiconductors fabricated using the embodiments described hereinabove may be used to produce substrates by cutting a wafer or cylinder from the bulk single-crystal, preparing a surface on the wafer or cylinder in a known manner to be receptive to an epitaxial layer, and depositing an epitaxial layer on the surface using conventional deposition techniques.

In particular embodiments of the invention, large, e.g. greater than about 25 mm in diameter, single-crystal AlN wafers are produced from single-crystal AlN boules having a diameter exceeding the diameter of the final substrate, e.g., boules having a diameter greater than about 30 mm. Using this approach, after growing the boule and orienting it, e.g. by employing x-ray Laue diffraction technique, to obtain a desirable crystallographic orientation for the wafer, the boule is mechanically ground down to a cylinder having a desirable diameter and then sliced into individual wafers, e.g., using a wire saw. In some versions of these embodiments, the boules are grown by, first, producing high-quality single-crystal seeds, and then using the seed crystals as nuclei to grow larger diameter single-crystal boules through a crystal-expansion growth run. Large-diameter slices from this second crystal growth process may then be utilized to grow large-diameter crystals without diameter expansion. In alternative versions, the crystal growth is self-seeded, i.e. the crystal is grown without employing single-crystal seeds.

In various embodiments, high-purity source material 230 including or consisting essentially of AlN may be produced in a crucible 205 (or other suitable container) by reacting high-purity Al (e.g. having 99.999% purity, available from Alpha Aesar of Ward Hill, Mass., USA) with high-purity $N_2$ gas (e.g. having 99.999% purity, available from Awesco of Albany, N.Y., USA). In a particular embodiment, pieces of high-purity AlN ceramic, e.g. weighing about 9 g or less, are placed in a bottom portion of the crucible and heated to about 2300° C. in a forming gas atmosphere in order to sublime the AlN and recondense it. As a result, the density of the resulting ceramic may be increased to approximately theoretical density by sublimation transport to decrease the surface area relative to the volume of the source material. The resulting AlN ceramic source material 230 may have impurity concentration of less than about 500 ppm.

In growth processes in accordance with various embodiments of the invention, the crucible 205 loaded with the source material 230 may be assembled and/or disposed in the heating apparatus, e.g. high-pressure crystal growth furnace available from Arthur D. Little, Inc. Specifically, the crucible 205 may be placed on crucible stand 210 within the susceptor 215. Both top thermal shields 250 and bottom thermal shields 255 may then be installed around the crucible 205 with the susceptor 215 around the crucible 205 and thermal shields. The crucible 205 is preferably positioned such that the lid 270 and/or seed crystal 235 is either below or above the location of the large axial thermal gradient formed by the thermal shields. In the first case (i.e. below the large axial gradient) the seed crystal 235 is initially maintained at a higher temperature than the source material 230 so that little or no nucleation occurs during a warm-up. If the seed crystal 235 is above the large axial gradient the initial nucleation is generally controlled by modification of the temperature ramp-up profile.

The growth chamber is then closed and evacuated, as described above, to reduce trace atmosphere contamination of the nucleation process and the resulting single crystal. In various embodiments, following evacuation, e.g., to less than about 1 Pa employing a mechanical Welch pump with minimum pressure of about ~0.5 Pa, the chamber is filled with a forming gas blend of 3% $H_2$ and 97% $N_2$ to a pressure of about 100 kPa and then evacuated again to less than 10 mTorr. This refill and pump process may be carried out three times or more to reduce chamber contamination. Following the pump and refill processes, the chamber is filled with the forming gas to a pressure of, e.g., 117 kPa. High-purity grade gas, e.g., available from GTS-WELCO (99.999% certified), may be used to further ensure a clean growth chamber atmosphere.

During a ramp to the growth temperature, the pressure in the chamber increases until the target growth pressure of, e.g., 124 kPa is reached. After reaching the operating pressure, the chamber pressure may be periodically checked and incrementally adjusted by releasing gas from the chamber to a vent line in order to keep the chamber pressure between, e.g., 124 kPa and 125 kPa.

In some embodiments, the power supply for operating the growth apparatus 200 is an RF oscillator with a maximum power output of 75 kW at 10 kHz. The growth temperature inside the heating apparatus may be increased in two ramp segments. For example, the first segment of the ramp may be linear for about 1.5 hours taking the top axial optical pyrometer temperature to about 1800° C. The second ramp segment may then be linear for approximately 3.5 hours taking the top axial temperature to about 2050° C. The chamber may then be maintained at growth temperature and pressure for a period of about 1 hour. Then, the crucible 205 may be moved up by the drive apparatus at a rate of, for example, approximately 0.5 mm/hr. During the growth run, this push rate is held constant, such that the total travel is about 30 mm, producing a single-crystal AlN boule that reached about 35 mm in length and about 50 mm in diameter. Shorter or longer crystals may be produced by varying the travel distance (which is directly related to the push time). The cool-down from growth temperature can be done linearly for the period of time between approximately 1 and approximately 24 hours. Once the apparatus is at room temperature, the chamber may be pumped to less than 1 Pa and backfilled to atmospheric pressure with the forming gas, allowing the chamber to be opened and the growth crucible assembly removed from the heating apparatus for evaluation. The growth chamber may then be closed and evacuated as described above to reduce trace atmosphere contamination of the growth cell, nucleation process and resulting AlN single crystal.

In particular embodiments, following pump-down to less than 7 mPa, e.g., using a turbo pump with a minimum pressure of about 0.4 mPa, the chamber is filled with a forming gas blend of 3% $H_2$ and 97% $N_2$ to a pressure of about 122 kPa. Following the pump and refill process, the chamber is filled with the forming gas for the start of the growth process to a pressure of 117 kPa. As described above, a high-purity grade gas available from GTS-WELCO (99.999% certified) may be used to further ensure a clean growth chamber atmosphere.

During a ramp to the growth temperature, the pressure in the chamber increases until the target growth pressure is reached. After reaching the operating pressure, the chamber pressure may be periodically checked and incrementally adjusted by releasing gas from the chamber to a vent line in order to keep the chamber pressure between, e.g., 124 kPa and 125 kPa.

The growth temperature inside the heating apparatus and crucible may be increased in two segments. For example, in the first segment, the temperature is linearly increased from the room temperature to about 1800° C. in 1.5 hours. Then, the second ramp segment to the final growth temperature determined by the optical pyrometer, e.g. for 3.5 hours, may be initiated after operator inspection.

The chamber is then maintained at the growth temperature and pressure for a period of, for example, 1 hour. The drive apparatus 260 then pushes the crucible 205 up at a rate ranging from about 0.2 to 1.0 mm/hr, for example, at approximately 0.5 mm/hr. In a particular version, during the growth run, this push rate is held constant and the total travel is about 30 mm, producing a single crystal AlN boule that reached about 50 mm in diameter and 35 mm in length. Shorter or longer crystals may be produced by varying the distance the crucible 205 is pushed or equivalently by varying the push time.

Following completion of the vertical travel, the vertical motion of the crucible 205 is stopped and the pressure is increased to 157 kPa by adding more high-purity forming gas. The power to the heating apparatus is then linearly reduced to zero, for example, in 6 hours and the system is allowed to cool to room temperature. Following the cool down, the chamber is pumped to, e.g., less than about 1 mPa and backfilled to atmospheric pressure with forming gas. The chamber is then opened and the growth crucible 205 removed for evaluation.

In various embodiments, after orienting the resulting single-crystal boule, e.g., by employing the x-ray Laue diffraction technique, the boule is encased in epoxy, e.g. VALTRON available from Valtech, and then ground down to a 25-mm diameter cylinder having its longitudinal axis oriented along the desired crystallographic direction. Once the oriented cylinder is produced, it is once again examined by the x-ray Laue diffraction technique to determine precise orientation (within +/−0.2°) and then sliced with a wire saw, e.g. the Model DT480 saw, for example, the one available from Diamond Wire Technologies, into a wafer. Those skilled in the art of semiconductor wafer preparation will readily recognize that there are many alternatives for slicing the crystal using diamond-coated ID and OD saws. The surface of the wafer is then prepared for epitaxial growth utilizing, for example, one or more techniques described in the '838 patent.

Seeded Growth Using Polished Semiconductor Wafers

In some embodiments, a piece of semiconductor material (e.g., including or consisting essentially of AlN) having a known crystallographic orientation is used as a seed from which bulk material may then be grown. In a particular embodiment, a polished AlN wafer sliced from a bulk crystal is employed as a seed, offering a number of benefits, including standardization and improved control over the growth direction.

In order to grow high-quality crystals, very high temperatures, for example exceeding 2100° C., are generally desirable. At the same time, as discussed above, high axial thermal gradients are needed to provide sufficient mass transport from the source material to the seed crystal. Additionally, non-zero radial thermal gradients, resulting in thermal gradient ratios less than 10 as detailed above, are preferably utilized to enable growth of larger crystals at faster rates while maintaining high crystalline quality. However, if not chosen properly, these growth conditions may result in evaporation of seed material or its total destruction and loss.

Preferably, the mounting technique employed in these embodiments to secure AlN seeds entails:

(1) employing a seed holder and/or adhesive compound that is sufficiently strong to secure the seed and the crystal being grown;

(2) protecting the opposite side of the seed during growth to avoid re-evaporation of the AlN, as this may result in formation of planar and/or extended void defects; and (3) avoiding contamination of the crystal and the crucible by the material chosen to protect the opposite side of the seed or as the adhesive.

In some embodiments, AlN seeded bulk-crystal growth is carried out in the crucible 205 using a high-purity AlN source 230. In some embodiments, the apparatus 200 for growth of single-crystal AlN boules includes a crucible 205 such as the one disclosed in U.S. Pat. No. 6,719,842 (the '842 patent), incorporated herein by reference in its entirety, consisting essentially of tungsten and fabricated by a CVD process. Multiple grain layers within the wall of the crucible may be obtained by interrupting the tungsten deposition several times before the final wall thickness is obtained. Other crucible materials may be used, such as tungsten-rhenium (W—Re) alloys; rhenium (Re); tantalum monocarbide (TaC); a mixture of $Ta_2C$ and TaC; a mixture of $Ta_2C$, TaC and Ta; tantalum nitride ($Ta_2N$); a mixture of Ta and $Ta_2N$; hafnium nitride (HfN); a mixture of Hf and HfN; a mixture of tungsten and tantalum (W—Ta); tungsten (W); and combinations thereof. The apparatus preferably houses an AlN source material 230, for example, consisting essentially of high-purity AlN polycrystalline ceramic.

The tungsten crucible is placed into an inductively heated furnace, as described above, so that the temperature gradient between the source 230 and the seed crystal 235 drives vapor 225 to move from the hotter high purity AlN ceramic source to the cooler seed crystal. The temperature at the seed interface and the temperature gradients are monitored and carefully adjusted, if necessary, in order to nucleate high-quality mono-crystalline material on the seed and not destroy the AlN seed. Skilled artisans will also readily recognize that while various embodiments of the present invention have been described herein as utilizing a seed crystal to promote crystal growth, the teachings herein may also be used for unseeded crystal growth, without departing from the scope and spirit of the present invention.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A crystal-growth system comprising:
    a growth chamber for the formation of a single-crystal semiconductor material via sublimation-recondensation therewithin along a growth direction;
    solid source material disposed within the growth chamber at a bottom surface thereof;
    disposed within the growth chamber and over and facing the solid source material, a seed crystal for nucleating the single-crystal semiconductor material thereon;
    a plurality of thermal shields arranged in a vertical stack disposed over the growth chamber, wherein (i) each thermal shield defines an opening therethrough, and (ii) the openings in the thermal shields increase in size among the thermal shields in a direction toward the solid source material.

2. The system of claim 1, wherein at least two of the thermal shields have different thicknesses.

3. The system of claim 1, wherein a thickness of each of the thermal shields ranges from 0.125 mm to 0.5 mm.

4. The system of claim 1, wherein at least one of the thermal shields comprises a refractory material.

5. The system of claim 1, wherein at least one of the thermal shields comprises tungsten.

6. The system of claim 1, wherein the thermal shields are arranged with spacings therebetween, the spacings being equal to each other ±10%.

7. The system of claim 1, wherein spacings between at least two pairs of the thermal shields are different.

8. The system of claim 1, wherein a diameter of the seed crystal is greater than 25 mm.

9. The system of claim 1, wherein the seed crystal comprises aluminum nitride.

10. The system of claim 1, further comprising a lid disposed on and at least partially enclosing the growth chamber, wherein the seed crystal is disposed beneath the lid.

11. The system of claim 10, wherein a thickness of the lid is less than 0.5 mm.

12. The system of claim 10, wherein the lid comprises tungsten.

13. The system of claim 1, wherein the seed crystal comprises single-crystal aluminum nitride.

14. The system of claim 1, wherein the solid source material comprises polycrystalline aluminum nitride.

15. The system of claim 1, wherein the thermal shields are arranged to form, within the growth chamber, (i) a first non-zero thermal gradient in a direction substantially parallel to the growth direction and (ii) a second non-zero thermal gradient in a direction substantially perpendicular to the growth direction.

16. The system of claim 15, wherein a ratio of the first thermal gradient to the second thermal gradient is less than 10.

17. The system of claim 15, wherein the second thermal gradient is larger than 4° C./cm.

18. The system of claim 15, wherein the second thermal gradient is smaller than 85° C./cm.

19. The system of claim 15, wherein the ratio of the first thermal gradient to the second thermal gradient is greater than 1.2.

20. The system of claim 15, wherein the first thermal gradient is larger than 5° C./cm.

21. The system of claim 15, wherein the first thermal gradient is smaller than 100° C./cm.

22. The system of claim 15, wherein the ratio of the first thermal gradient to the second thermal gradient is less than 5.5.

23. The system of claim 15, wherein the ratio of the first thermal gradient to the second thermal gradient is less than 3.

24. The system of claim 1, wherein the growth chamber comprises at least one of tungsten, rhenium, tantalum, tantalum carbide, tantalum nitride, hafnium, or hafnium nitride.

\* \* \* \* \*